United States Patent
Eroz et al.

(10) Patent No.: US 8,392,793 B2
(45) Date of Patent: *Mar. 5, 2013

(54) CODE DESIGN AND IMPLEMENTATION IMPROVEMENTS FOR LOW DENSITY PARITY CHECK CODES FOR MULTIPLE-INPUT MULTIPLE-OUTPUT CHANNELS

(75) Inventors: Mustafa Eroz, Germantown, MD (US); Lin-Nan Lee, Potomac, MD (US); Feng-Wen Sun, Germantown, MD (US)

(73) Assignee: DTVG Licensing, Inc., El Segundo, CA (US)

(*) Notice: Subject to any disclaimer, the term of this patent is extended or adjusted under 35 U.S.C. 154(b) by 419 days.

This patent is subject to a terminal disclaimer.

(21) Appl. No.: 12/753,528

(22) Filed: Apr. 2, 2010

(65) Prior Publication Data

US 2010/0192038 A1 Jul. 29, 2010

Related U.S. Application Data

(62) Division of application No. 11/201,796, filed on Aug. 11, 2005, now Pat. No. 7,725,802.

(60) Provisional application No. 60/601,533, filed on Aug. 13, 2004.

(51) Int. Cl.
*H03M 13/00* (2006.01)

(52) U.S. Cl. ........................................ 714/758; 714/781

(58) Field of Classification Search .................. 714/758, 714/781
See application file for complete search history.

(56) References Cited

U.S. PATENT DOCUMENTS

| | | | |
|---|---|---|---|
| 4,709,377 A | 11/1987 | Martinez et al. |
| 5,371,471 A | 12/1994 | Chennakeshu et al. |
| 5,467,132 A | 11/1995 | Fazel et al. |
| 5,949,796 A | 9/1999 | Kumar |
| 6,031,874 A | 2/2000 | Chennakeshu et al. |
| 6,115,427 A | 9/2000 | Calderbank et al. |
| 6,292,917 B1 | 9/2001 | Sinha et al. |
| 6,405,338 B1 | 6/2002 | Sinha et al. |
| 6,438,180 B1 | 8/2002 | Kavcic et al. |
| 6,510,536 B1 | 1/2003 | Crozier et al. |
| 6,518,892 B2 | 2/2003 | Shen et al. |

(Continued)

FOREIGN PATENT DOCUMENTS

| | | |
|---|---|---|
| EP | 1093231 A1 | 4/2001 |
| WO | 2003/001726 | 1/2003 |

(Continued)

OTHER PUBLICATIONS

Non-final Office action dated Mar. 5, 2012 in U.S. Appl. No. 13/153,076, filed Jun. 3, 2011 by Mustafa Eroz et al.

(Continued)

*Primary Examiner* — Joseph D Torres

(57) ABSTRACT

Methods include configuring M parallel accumulation engines, accumulating a first information bit at a first set of specific parity bit addresses using the accumulation engines, increasing a parity bit address for each member of the first set of specific parity bit addresses by a pre-determined offset for each new information bit, accumulating subsequent information bits at parity bit addresses that are offset from the specific parity bit addresses by a pre-determined offset until an M+1 information bit is reached, accumulating the next M information bits at a second set of specific parity bit addresses using the accumulation engines, increasing a parity bit address for each member of the second set of specific parity bit addresses by the pre-determined offset for each new information bit; and repeating accumulating and increasing the addresses until the information bits are exhausted. Related systems are described.

19 Claims, 7 Drawing Sheets

U.S. PATENT DOCUMENTS

| | | | |
|---|---|---|---|
| 6,539,367 | B1 | 3/2003 | Blanksby et al. |
| 6,751,770 | B2 | 6/2004 | Morelos-Zaragoza |
| 6,769,091 | B2 | 7/2004 | Classon et al. |
| 6,785,863 | B2* | 8/2004 | Blankenship et al. ......... 714/799 |
| 6,789,227 | B2* | 9/2004 | De Souza et al. ............. 714/804 |
| 6,829,308 | B2 | 12/2004 | Eroz et al. |
| 6,857,097 | B2 | 2/2005 | Yedidia et al. |
| 6,895,547 | B2 | 5/2005 | Eleftheriou et al. |
| 6,938,196 | B2 | 8/2005 | Richardson et al. |
| 6,965,652 | B1* | 11/2005 | Burd et al. .................... 375/341 |
| 6,985,536 | B2 | 1/2006 | Oelcer et al. |
| 7,000,177 | B1 | 2/2006 | Wu et al. |
| 7,017,106 | B2 | 3/2006 | Shen et al. |
| 7,072,417 | B1* | 7/2006 | Burd et al. .................... 375/295 |
| 7,165,205 | B2* | 1/2007 | Blankenship et al. ......... 714/752 |
| 7,178,082 | B2* | 2/2007 | Yu et al. ........................ 714/752 |
| 7,184,486 | B1 | 2/2007 | Wu et al. |
| 7,191,378 | B2* | 3/2007 | Eroz et al. ..................... 714/758 |
| 7,234,098 | B2* | 6/2007 | Eroz et al. ..................... 714/758 |
| 7,237,174 | B2* | 6/2007 | Eroz et al. ..................... 714/758 |
| 7,269,776 | B2* | 9/2007 | Park et al. ..................... 714/752 |
| 7,334,181 | B2* | 2/2008 | Eroz et al. ..................... 714/801 |
| 7,376,883 | B2* | 5/2008 | Eroz et al. ..................... 714/758 |
| 7,421,644 | B2 | 9/2008 | Mantha et al. |
| 7,424,662 | B2* | 9/2008 | Eroz et al. ..................... 714/758 |
| 7,483,496 | B2* | 1/2009 | Eroz et al. ..................... 375/316 |
| 7,562,280 | B2* | 7/2009 | Eroz et al. ..................... 714/755 |
| 7,577,207 | B2* | 8/2009 | Eroz et al. ..................... 375/261 |
| 7,620,880 | B2 | 11/2009 | Niu et al. |
| 7,673,226 | B2* | 3/2010 | Eroz et al. ..................... 714/801 |
| 7,725,802 | B2* | 5/2010 | Eroz et al. ..................... 714/758 |
| 7,770,089 | B2* | 8/2010 | Eroz et al. ..................... 714/758 |
| 7,856,586 | B2* | 12/2010 | Eroz et al. ..................... 714/758 |
| 8,144,801 | B2 | 3/2012 | Eroz et al. |
| 2002/0021770 | A1 | 2/2002 | Beerel et al. |
| 2002/0048329 | A1 | 4/2002 | Tran et al. |
| 2002/0051499 | A1 | 5/2002 | Cameron et al. |
| 2002/0071504 | A1 | 6/2002 | Chen et al. |
| 2002/0136318 | A1 | 9/2002 | Gorokhov et al. |
| 2005/0149841 | A1 | 7/2005 | Kyung et al. |
| 2005/0257124 | A1 | 11/2005 | Richardson et al. |
| 2006/0156181 | A1 | 7/2006 | Ha et al. |
| 2008/0189589 | A1 | 8/2008 | Park et al. |
| 2008/0282127 | A1 | 11/2008 | Mantha et al. |
| 2009/0187811 | A1* | 7/2009 | Eroz et al. ..................... 714/782 |
| 2010/0269011 | A1 | 10/2010 | Oh et al. |
| 2011/0138248 | A1 | 6/2011 | Wu et al. |
| 2011/0252286 | A1 | 10/2011 | Li et al. |

FOREIGN PATENT DOCUMENTS

| | | |
|---|---|---|
| WO | 2004/077733 | 9/2004 |

OTHER PUBLICATIONS

Notice of Allowance dated Oct. 17, 2011 in U.S. Appl. No. 12/498,968, filed Jul. 7, 2009 by Mustafa Eroz et al.
Notice of Allowance dated Jun. 13, 2012 in U.S. Appl. No. 13/153,076, filed Jun. 3, 2011 by Mustafa Eroz et al.
Notice of Allowance dated Nov. 16, 2011 in U.S. Appl. No. 12/967,894, filed Dec. 14, 2010 by Mustafa Eroz et al.
Non-final Office action dated May 12, 2011 in U.S. Appl. No. 11/938,110, filed Nov. 9, 2007 by Mustafa Eroz et al.
Non-final Office action dated Apr. 25, 2011 in U.S. Appl. No. 12/967,894, filed Dec. 14, 2010 by Mustafa Eroz et al.
Non-final Office action dated May 16, 2011 in U.S. Appl. No. 12/498,968, filed Jul. 7, 2009 by Mustafa Eroz et al.
Non-final Office action dated May 19, 2011 in U.S. Appl. No. 11/938,016, filed Nov. 9, 2007 by Mustafa Eroz et al.
Japanese Office action dated Apr. 19, 2011 in Japanese Patent Application No. 2007-525661 filed Aug. 3, 2005 by Mustafa Eroz et al.
Chinese Office action dated Jul. 22, 2011 in Chinese Patent Application No. 03800852.1 filed Jul. 3, 2003 by Mustafa Eroz et al.
Notice of Allowance dated Jan. 21, 2011 in U.S. Appl. No. 12/195,512, filed Aug. 21, 2008 by Mustafa Eroz et al.
Notice of Allowance dated Feb. 9, 2011 in U.S. Appl. No. 11/710,761, filed Feb. 26, 2007 by Mustafa Eroz et al.
Canadian Office action dated May 7, 2010 in Canadian Patent Application No. 2456485 filed Jul. 3, 2003 by Mustafa Eroz et al.
European Search Report dated May 10, 2010 in European divisional Patent Application No. 10001217.8 filed Jul. 3, 2003 (parent filed of European Patent Application No. 03763495.3) by Mustafa Eroz et al.
Bond, J.W.; Hui, S.; Schmidt, H.; "Constructing Low-Density Parity-Check Codes"; EuroComm 2000; Information Systems for Enhanced Public Safety and Security; IEEE/AFCEA; May 17, 2000; Piscataway, New Jersey, USA; IEEE LNKD- DOI:10.1109/EURCOM2000.874812; Jan. 1, 2000; pp. 260-262; XP010515080; ISBN: 978-0-7803-6323-6.
Bond, J.W.; Hui, S.; Schmidt, H.; "Constructing Low-Density Parity-Check Codes with Circulant Matrices"; Information Theory and Networking Workshop; 1999; Metsovo, Greece; Jun. 27-Jul. 1, 1999 p. 52; XP010365561; ISBN:978-0/7803-5954-3.
Yi, Yu; Hou, Jia; Lee, Moon Ho; "Design of Semi-Algebraic Low-Density Parity-Check (SA-LDPC) Codes for Multilevel Coded Modulation"; Proceedings, IEEE International Conference on Parallel and Distributed Computing, Applications and Technologies; PDCAT' 2003; Aug. 27, 2003; pp. 931-934; XP010661473; ISBN: 978-0-7803-7840-7.
Vasic, Bane; Djordjevic, Ivan B.; "Low-Density Parity Check Codes for Long-Haul Optical Communication Systems"; IEEE Photonics Technology Letters; IEEE Photonics Technology Letters; IEEE Service Center; Piscataway, New Jersey, USA; vol. 14, No. 8; Aug. 1, 2002; XP011067271; ISSN:1041-1135.
Johnson, Sarah J.; Weller, Steven R.; "A Family of Irregular LDPC Codes with Low Encoding Complexity"; IEEE Communications Letters; IEEE Service Center; Piscataway, New Jersey, USA; vol. 7, No. 2; Feb. 1, 2003; XP011066488; ISSN:1089-7798.
Notice of Allowance dated Sep. 7, 2011 in U.S. Appl. No. 11/938,016, filed Nov. 9, 2007 by Mustafa Eroz et al.
Rejection Decision dated Nov. 11, 2011 in Chinese Patent Application No. 03800852.1, filed Jul. 3, 2003 by Mustafa Eroz et al.
Non-final Office action dated Aug. 16, 2010 in U.S. Appl. No. 12/195,512, filed Aug. 21, 2008 by Mustafa Eroz et al.
Notice of Allowance dated Aug. 24, 2010 in U.S. Appl. No. 10/961,124, filed Oct. 8, 2004 by Mustafa Eroz et al.
Futaki, Hisashi; Ohtsuki, Tomoaki; "Low-Density Parity-Check (LDPC) Coded OFDM Systems with M-PSK"; Proceedings of the IEEE 55th Vehicular Technology Conference; 2002; VTC Spring; May 6, 2002; vol. 2; pp. 1035-1039.
Notice of Allowance dated Nov. 18, 2011 in U.S. Appl. No. 11/938,110, filed Nov. 9, 2007 by Mustafa Eroz et al.
Non-final Office action dated Aug. 21, 2012 in U.S. Appl. No. 13/408,953, filed Feb. 29, 2012 by Mustafa Eroz et al.

* cited by examiner

CODE DESIGN AND IMPLEMENTATION IMPROVEMENTS FOR LOW DENSITY PARITY CHECK CODES FOR MULTIPLE-INPUT MULTIPLE-OUTPUT CHANNELS

CROSS-REFERENCE TO RELATED APPLICATIONS

This application is a divisional application of U.S. patent application Ser. No. 11/201,796, filed on Aug. 11, 2005, which claims the benefit under 35 U.S.C. Section 119(e) of the following co-pending and commonly-assigned U.S. provisional patent application:

Provisional Application Ser. No. 60/601,533, filed Aug. 13, 2004, by Mustafa Eroz et al., entitled "CODE DESIGN AND IMPLEMENTATION IMPROVEMENTS FOR LOW DENSITY PARITY CHECK CODES FOR MULTIPLE-INPUT MULTIPLE-OUTPUT CHANNELS," which applications are incorporated by reference herein.

BACKGROUND OF THE INVENTION

1. Field of the Invention

The present invention relates generally to a digital signal delivery systems, and in particular, to design and implementation for Low Density Parity Check (LDPC) codes for multiple-input, multiple-output channels within a digital signal delivery system.

2. Description of the Related Art

Radio Frequency (RF) transmission of information has become commonplace. Typically, a single transmit antenna sends a signal which can be received by one or more receive antennas. Examples of such systems include satellite broadcasts, such as satellite television broadcasting, radio, and cellular telephone systems.

Because of the ease of use of such systems, larger and larger demands for higher speed data transfer through such systems have taken place. Wireless internet access, which requires the transfer of large amounts of data for pictures, audio, and other data requires a large throughput via a single transmit antenna system. Many of these systems are now reaching their data throughput limits, making it difficult to provide wireless data transfer in areas that such services are desired.

There is a current movement to have Multiple Input Multiple Output (MIMO) systems that employ multiple transmit antennas and multiple receive antennas to increase the data throughput. Examples of MIMO systems are wireless Local Area Networks (LANs), Bluetooth networks, and high-speed wireless (Wi-Fi) networks. MIMO systems use multiple signal paths, which in standard systems would cause multipath errors and interference, to transmit additional data from one place to another. Algorithms for properly transmitting and subsequently recombining the MIMO transmitted data at the receiver must be conceived and transmitted along with the MIMO data for such systems to properly function.

Just as with single transmit antenna systems, the data frames in a MIMO system are coded in such a manner that they can interfere with each other, and MIMO receivers cannot tell which packets of data goes first, or whether the data within a given frame is corrupted by constructive or destructive interference. Such interference is called "co-channel" interference, where one channel of data interferes with the reception and demodulation of another channel of data. In practical applications, the co-channel interference may also stem from transmission of other system operators or other spot transmission beams in a MIMO system. As MIMO systems transmit more data, the interference between data packets will increase, and, as such, the quality of the signal reception will be poorer.

To ensure that transmission systems can properly decode transmitted data, error correction codes, specifically, Forward Error Correction (FEC) codes are used. However, in MIMO systems, FEC codes cannot be chosen randomly because of the potential interference of these codes with each other.

Traditionally, the negative effects of such interference have been minimized by redesigning the frequency assignments assigned to the various transmitters and receivers. However, since the frequencies are fixed by standard, frequency reassignment or frequency reuse will not alleviate the problem beyond a certain point.

It can be seen, then, that there is a need in the art to minimize the interference in a broadcasting system. It can also be seen that there is a need in the art for proper selection of FEC codes in a MIMO system.

SUMMARY OF THE INVENTION

To minimize the limitations in the prior art, and to minimize other limitations that will become apparent upon reading and understanding the present specification, the present invention discloses methods and systems for designing LDPC codes. A method in accordance with the present invention comprises configuring a plurality of parallel accumulation engines, a number of the plurality of parallel accumulation engines equal to M, accumulating a first information bit at a first set of specific parity bit addresses using the plurality of parallel accumulation engines, increasing a parity bit address for each member of the first set of specific parity bit addresses by a pre-determined offset for each new information bit, accumulating subsequent information bits at parity bit addresses that are offset from the specific parity bit addresses by a pre-determined offset until an M+1 information bit is reached, accumulating the next M information bits at a second set of specific parity bit addresses using the plurality of parallel accumulation engines, increasing a parity bit address for each member of the second set of specific parity bit addresses by the pre-determined offset for each new information bit; and repeating accumulating and increasing the addresses until the information bits are exhausted.

The method can optionally include use of the LDPC codes in a Multiple-Input, Multiple-Output (MIMO) system, use in an LDPC encoder, having the pre-determined offset be code-dependent, and accumulating the parity bits by adding each parity bit address to the immediately preceding parity bit address.

A system in accordance with the present invention comprises a plurality of parallel accumulation engines, a number of the plurality of parallel accumulation engines equal to M, and a parity bit check matrix, wherein a first information bit is accumulated at a first set of specific parity bit addresses using the plurality of parallel accumulation engines, the parity bit addresses for each member of the first set of specific parity bit addresses are increased by a pre-determined offset for each new information bit, subsequent information bits are accumulated at parity bit addresses that are offset from the specific parity bit addresses by the pre-determined offset until an M+1 information bit is reached, a next M information bits are accumulated at a second set of specific parity bit addresses using the plurality of parallel accumulation engines, wherein the parity bit addresses for each member of the second set of specific parity bit addresses are increased by the pre-determined offset for each new information bit, and each information bit in the plurality of information bits is accumulated using additional sets of specific parity bit addresses and pre-determined offsets until all information bits in the plurality of information bits are accumulated.

The system can optionally include use of the LDPC codes in a Multiple-Input, Multiple-Output (MIMO) system, use in an LDPC encoder or decoder, having the pre-determined offset be code-dependent, and accumulating the parity bits by adding each parity bit address to the immediately preceding parity bit address.

Another method in accordance with the present invention comprises accumulating a first information bit using a plurality of parallel accumulation engines at a first set of specific parity bit addresses using the plurality of parallel accumulation engines, increasing a parity bit address for each member of the first set of specific parity bit addresses by a pre-determined offset for each new information bit, accumulating subsequent information bits at parity bit addresses that are offset from the specific parity bit addresses by a pre-determined offset until an information bit is reached having an index number equal to a number of the plurality of parallel accumulation engines, accumulating the next number of the plurality of parallel accumulation engine information bits at a second set of specific parity bit addresses using the plurality of parallel accumulation engines, and increasing a parity bit address for each member of the second set of specific parity bit addresses by the pre-determined offset for each new information bit; wherein each information bit in the plurality of information bits is accumulated using additional sets of specific parity bit addresses and pre-determined offsets until all information bits in the plurality of information bits are accumulated.

The method can optionally include use of the LDPC codes in a Multiple-Input, Multiple-Output (MIMO) system, use in an LDPC encoder or decoder, having the pre-determined offset be code-dependent, and accumulating the parity bits by adding each parity bit address to the immediately preceding parity bit address.

Other features and advantages are inherent in the system and method claimed and disclosed or will become apparent to those skilled in the art from the following detailed description and its accompanying drawings.

BRIEF DESCRIPTION OF THE DRAWINGS

Referring now to the drawings in which like reference numbers represent corresponding parts throughout.

DETAILED DESCRIPTION OF PREFERRED EMBODIMENTS

In the following description, reference is made to the accompanying drawings which form a part hereof, and which show, by way of illustration, several embodiments of the present invention. It is understood that other embodiments may be utilized and structural changes may be made without departing from the scope of the present invention.

Overview

The present invention uses Low Density Parity Check (LDPC) codes to increase the performance of MIMO systems, within a few dB of the theoretical limit of such systems, without unduly increasing the complexity of the circuitry needed to generate and decode the LDPC codes of the present invention.

LDPC codes were discovered by Gallager in 1962, but they were not given much attention for decades as the technology at the time was not mature for efficient implementation. Motivated by the success of iterative decoding of turbo codes, LDPC codes were reintroduced in 1995, generating great interest and activity on the subject. Unlike turbo codes, LDPC codes have an easily parallelizable decoding algorithm which consists of simple operations such as addition, comparison and table look-up. Despite the simplicity of the decoding algorithm and operations, the challenge in the design is how to establish the communication between "randomly" distributed bit nodes and check nodes.

A fully parallel architecture where there are as many physical nodes in the circuit as the logical nodes of the code becomes rapidly infeasible with increasing block size due to complexity of interconnections between the nodes. However, for a partially parallel architecture, where a small number of physical nodes are re-used to serve all the logical nodes, the main problem is to access relevant information for the logical nodes in process, fast enough from memory in high speed applications.

Multiple-antenna input multiple-antenna output systems have recently gained popularity as an effective way to combat multi-path fading channels. Space time codes were introduced to maximize the diversity and coding gain for these systems. However, the coding gain delivered by reasonable complexity space-time codes are not sufficient. As a result, performance of space-time codes fall far away from what can be achieved.

The present invention replaces the space-time codes with LDPC codes to improve the performance of MIMO systems. Further, the present invention illustrates the method for generating proper LDPC codes for such systems to increase data throughput and improve performance. The present invention provides a method for designing LDPC codes that are encoded using only their parity check matrices.

System Diagram

Figure 1:
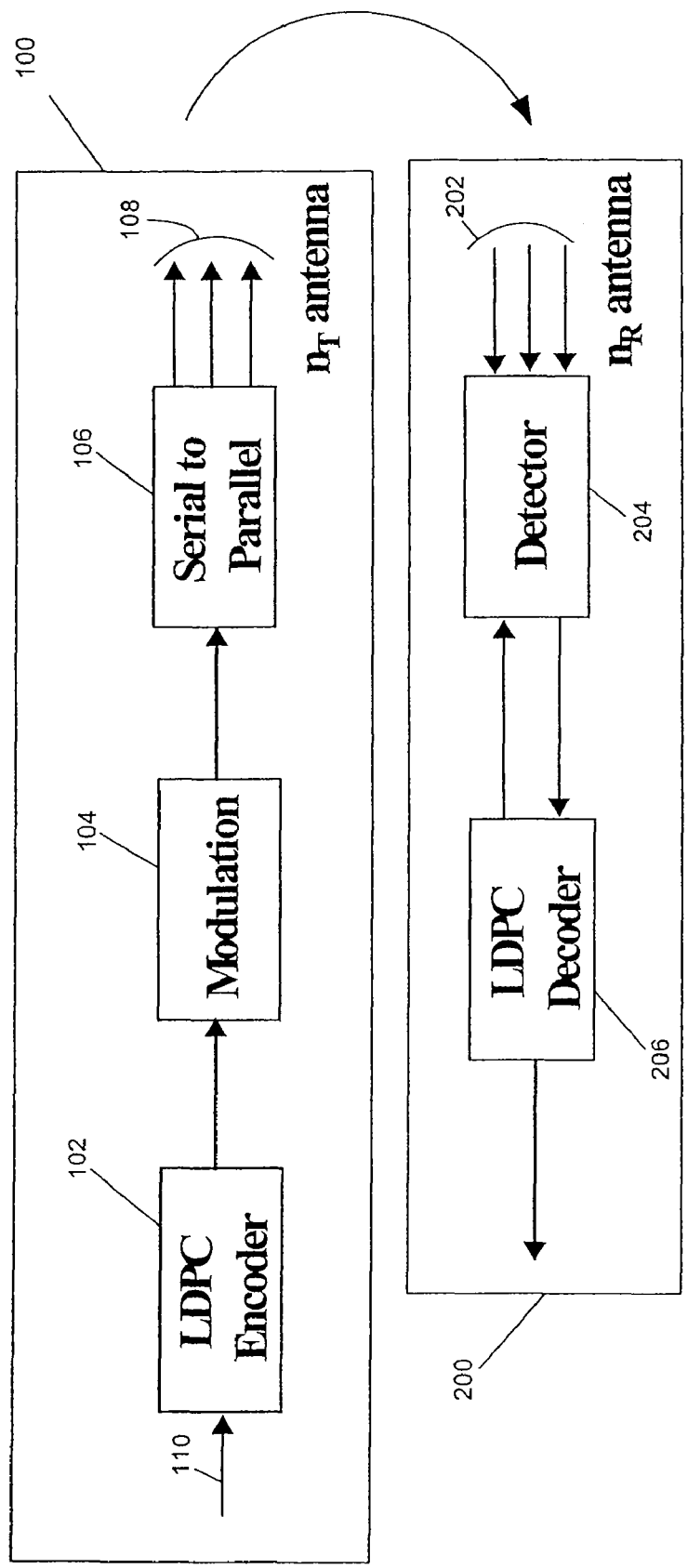
FIG. 1 illustrates a system block diagram of an LDPC-coded MEMO system of the present invention.

FIG. 1 illustrates a system block diagram of an LDPC-coded MIMO system of the present invention.

Transmitter 100 and receiver 200 are shown in a MIMO system. Within transmitter 100, there is an LDPC encoder 102, modulator 104, and a Serial-to-Parallel module 106, which feeds multiple antenna feeds 108. Within receiver 200, there are multiple antenna feeds 202, which are input to detector 204, which communicates with LDPC decoder 206. Additionally, orthogonal frequency division multiplexing and other circuitry can be inserted between modulator/detector and the channel without affecting the scope of the present invention.

For a MIMO system, the LDPC encoder 102 and LDPC decoder 206 of the present invention replace other FEC (e.g., turbo codes) generators. However, because of the potential complexity of LDPC codes, the present invention generates the LDPC codes in a specific way for use in a MIMO system.

In broadcast applications, such as MIMO systems, continuous mode receivers are widely used. Codes that perform well in low signal-to-noise (SNR) environments are at odds with these receivers 105 with respect to synchronization (e.g., carrier phase and carrier frequency). Many digital broadcast systems require use of additional training symbols beyond that of the normal overhead bits in a frame structure for their synchronization processes. The increase in overhead is particularly required when the Signal-to-Noise (SNR) is low; such an environment is typical when high performance codes are used in conjunction with high order modulation. Traditionally, continuous mode receivers utilize a feedback control loop to acquire and track carrier frequency and phase. Such approaches that are purely based on feedback control loops are prone to strong Radio Frequency (RF) phase noise and thermal noise, causing high cycle slip rates and an error floor on the overall receiver performance. Thus these approaches are burdened by increased overhead in terms of training symbols for certain performance target, in addition to limited acquisition range and long acquisition time. Further, these conventional synchronization techniques are dependent on the particular modulation scheme, thereby hindering flexibility in use of modulation schemes.

The LDPC or other FEC code or codes that are generated by the transmitter 100 facilitate high speed implementation without incurring any performance loss. These structured LDPC codes output from the transmitter 100 avoid assignment of a small number of check nodes to the bit nodes already vulnerable to channel errors by virtue of the modulation scheme (e.g., 8PSK). Such LDPC codes have a parallelizable decoding process, unlike turbo codes, which advantageously involves simple operations such as addition, comparison and table look-up. Moreover, carefully designed LDPC codes do not exhibit any sign of error floor. If an error floor were to exist, it would be possible to use another code, such as a Bose/Chaudhuri/Hocquenghem (BCH) code or other codes, to significantly suppress such error floor.

According to one embodiment of the present invention, the transmitter 100 generates, using a relatively simple encoding technique as explained herein below, LDPC codes based on parity check matrices which facilitate efficient memory access during decoding to communicate with receiver 200 in a MIMO system.

Transmitter 100 uses LDPC encoder 102 that accepts input 110 from an information source and outputs a coded information stream of higher redundancy suitable for error correction processing at the receiver 200. The information source generates k signals from a discrete alphabet, X LDPC codes are specified with parity check matrices. Encoding LDPC codes requires, in general, specifying the generator matrices.

LDPC Encoder 203 generates signals using the input 110 and passes these signals to a modulator 205, using a simple encoding technique that makes use of only the parity check matrix by imposing structure onto the parity check matrix. Specifically, a restriction is placed on the parity check matrix by constraining certain portions of the matrix. Such a restriction results in negligible performance loss, and therefore, constitutes an attractive trade-off.

Transmission Schema

As shown in FIG. 1, there are $n_T$ transmit antennas 108 and $n_R$ receive antennas 202. The transmission for one channel is represented as r=As+n, where
$s=[s_1, s_2, \ldots, s_{n_T}]$ is the transmitted symbol vector,
$r=[r_1, r_2, \ldots, r_{n_R}]$ is the received symbol vector $$A = \begin{bmatrix} a_{1,1} & a_{1,2} & \cdots & a_{1,n_T} \\ a_{2,1} & a_{2,2} & \cdots & a_{2,n_T} \\ \vdots & \vdots & \vdots & \vdots \\ a_{n_R,1} & a_{n_R,2} & \cdots & a_{n_R,n_T} \end{bmatrix}$$

is the complex fade values matrix between each pair of antennas, where $|a_{i,j}|$ is assumed Rayleigh distributed. and n is the Average White Gaussian Noise (AWGN) noise vector.

For A matrices of subsequent channel uses, there are two extreme cases of interest, namely where A changes independently for each channel use (i.e. ideal interleaving), and where A is constant for the entire FEC frame (i.e. quasi-static fading).

The present invention applies specific LDPC codes for the MIMO channels described with the linear algebra described above. Maintaining high performance of the LDPC codes within the MIMO channels while maintaining an easy memory access feature of the subset of possible LDPC codes is an important feature of the code selection.

Design of the LDPC Codes and Constellation Bit Labelings

Figure 2:
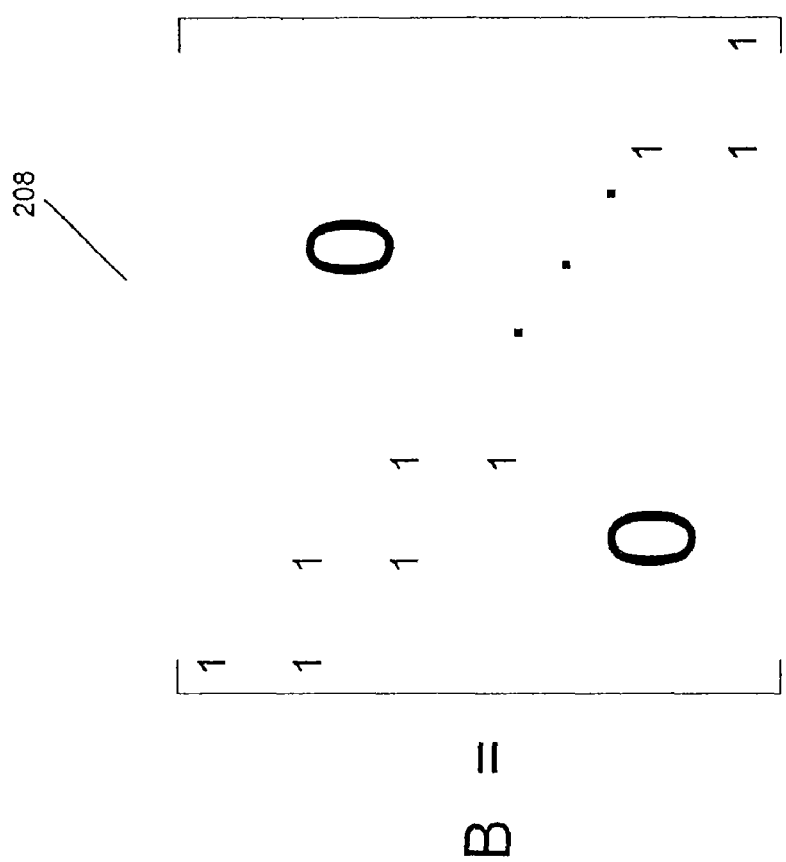
FIG. 2 illustrates a submatrix of the parity check matrix of the present invention.

FIG. 2 illustrates a submatrix of the parity check matrix of the present invention.

The present invention restricts the parity check matrix of the LDPC codes as follows:

For a group of M bit nodes, if the check nodes connected to the first bit node of degree, say $d_v$, are numbered as $a_1$, $a_2, \ldots, a_{d_v}$ then the check nodes connected to $i^{th}$ bit node (i≦M) are numbered as, $\{a_1+(i-1)q\} \bmod (N-K), \{a_2+(i-1)q\} \bmod (N-K), \ldots,$
$\quad \{a_{d_v}+(i-1)q\} \bmod (N-K)$ where N−K=total number of check nodes and $$q = \frac{N-K}{M}.$$

For the following groups of M bit nodes, the check nodes connected to the first bit node of the group are in general randomly chosen so that at the end, all check nodes have the same degree, except for one check node with one less degree. Furthermore, the present invention includes a random search over these free constants $a_1, a_2, \ldots, a_{d_v}$, i.e., check nodes connected to the first bit node in every group of M so that the resulting LDPC code has optimum performance on MIMO channels. Moreover the imposed structure on the parity check matrix 208 definition leads to efficient memory access.

In addition to the previous restriction, the parity check matrix is restricted to be of the form, $H_{(N-K)\times N}=[A_{(N-K)\times K} B_{(N-K)\times(N-K)}]$ where B is staircase lower triangular as shown in FIG. 2, in other words only the A=$[a_{mn}]$ sub-matrix 208 is chosen according to the previous paragraph. From the structure of the B sub-matrix 208, the first check node has one less degree than the others.

Further, the LDPC encoder 102 of the present invention systematically encodes an information block i of size k, e.g., $i=(i_0, i_1, \ldots, i_{k-1})$ onto a codeword c of size n, e.g., $c=(i_0, i_1, i_{k-1}, p_0, p_1, \ldots p_{n-k-1})$. The transmission of the codeword starts in the given order from $i_0$ and ends with $p_{n-k-1}$. The n codeword bits are first mapped to n/C constellation symbols where $2^C$ is the constellation size. The modulated symbols are then sent through $n_T$ transmit antennas in n/(C×$n_T$) channel use. LDPC code parameters (n,k) are given in Table 1 for various code rates. The number of bit nodes with corresponding degrees are shown in Table 2.

The task of the encoder 102 is to determine n-k parity bits $(p_0, p_1, \ldots, p_{n-k-1})$ for every block of k information bits, $(i_0, i_1, \ldots, i_{k-1})$. A number of parallel engines are chosen, and each parallel engine accumulates information bits at specific parity bit addresses. For example, and not by way of limitation, 400 parallel engines can be chosen. A larger or smaller number of parallel engines can be chosen without departing from the scope of the present invention.

First, the parity bits are initialized to zero, i.e., $p_0 = p_1 = p_2 = \ldots = p_{n-k-1} = 0$.

Then, a first information bit, $i_0$, is accumulated at specific parity bit addresses, namely, at those parity bit addresses specified in the first row of Tables 4 through 6, with a code rate dependent offset for each increase in information bit. Other parity bit addresses and offsets can be used without departing from the scope of the present invention. For example, for rate 2/3 (Table 4), the accumulations are as follows:

$p_0 = p_0 \oplus i_0$, $p_{1531} = p_{1531} \oplus i_0$, $p_{876} = p_{876} \oplus i_0$,
$p_{3403} = p_{3403} \oplus i_0$, $p_{1298} = p_{1298} \oplus i_0$,
$p_{3085} = p_{3085} \oplus i_0$, $p_{277} = p_{277} \oplus i_0$, $p_{2316} = p_{2316} \oplus i_0$,
$p_{1180} = p_{1180} \oplus i_0$, $p_{2988} = p_{2988} \oplus i_0$,
$p_{3233} = p_{3233} \oplus i_0$, $p_{1851} = p_{1851} \oplus i_0$, and
$p_{2127} = p_{2127} \oplus i_0$, where all additions are in Generic Fast addition (2) (GF(2)) format.

Continuing with the present example, the accumulation for the next 399 information bits is done at $i_m$, m=1, 2, ... 99 accumulate $i_m$ at parity bit addresses {x+m mod 400×q} mod (n−k) where x denotes the address of the parity bit accumulator corresponding to the first bit $i_0$, and q is a code rate dependent offset constant specified in Table 3.

Continuing with the present example, q=10 for rate 2/3. So for example for information bit $i_1$, the accumulations take place at the offset parity bit matrix locations as follows:
$p_{10} = p_{10} \oplus i_1$, $p_{1541} = p_{1541} \oplus i_1$, $p_{886} = p_{886} \oplus i_1$, $p_{3413} = p_{3413} \oplus i_1$, $p_{1308} = p_{1308} \oplus i_1$, $p_{3095} = p_{3095} \oplus i_1$, $p_{287} = p_{287} \oplus i_1$, $p_{2326} = p_{2326} \oplus i_1$, $p_{1190} = p_{1190} \oplus i_1$, $p_{2998} = p_{2998} \oplus i_1$, $p_{3243} = p_{3243} \oplus i_1$, $p_{1861} = p_{1861} \oplus i_1$, and $p_{2137} = p_{2137} \oplus i_1$. Such accumulations then occur for the next 400 information bits as processed by the 400 parallel engines at the offset parity bit matrix locations.

For the 401$^{st}$ information bit, i.e., $i_{400}$, the present invention switches the location of where the accumulation takes place. The addresses of the parity bit accumulators for the next number of parallel engine calculations are given in the second row of Tables 4 through 7. In a similar manner the addresses of the parity bit accumulators for the following 399 information bits $i_m$, m=401, 402, ..., 799 are obtained using the formula {x+m mod 400×q} mod (n−k) where x denotes the address of the parity bit accumulator corresponding to the information bit $i_{400}$, i.e. the entries in the second row of the Tables 4 through 7.

In a similar manner, for every group of 400 new information bits, a new row from Tables 4 through 7 are used to find the addresses of the parity bit accumulators. After all of the information bits are exhausted, the final parity bits are obtained as follows, Sequentially perform the following operations starting with i=1, i.e., $p_i = p_i \oplus p_{i-1}$, i=1, 2, ..., n−k−1, and the final content of $p_i$, i=0, 1, ..., n−k−1 is equal to the parity bit $p_i$.

At the receiver, LDPC decoder and detector iterate soft information back and forth to improve the performance. A detector iteration is performed after every three LDPC decoder iteration.

Performance Results

Figure 3A:
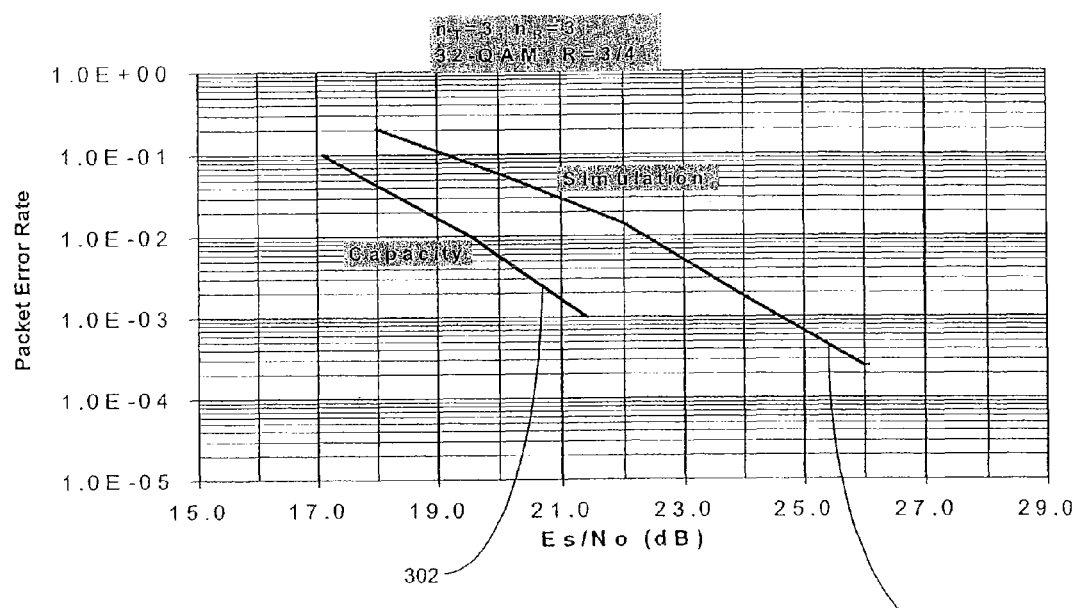
FIGS. 3A-3C illustrate simulations of the performance of the present invention.
Figure 3B:
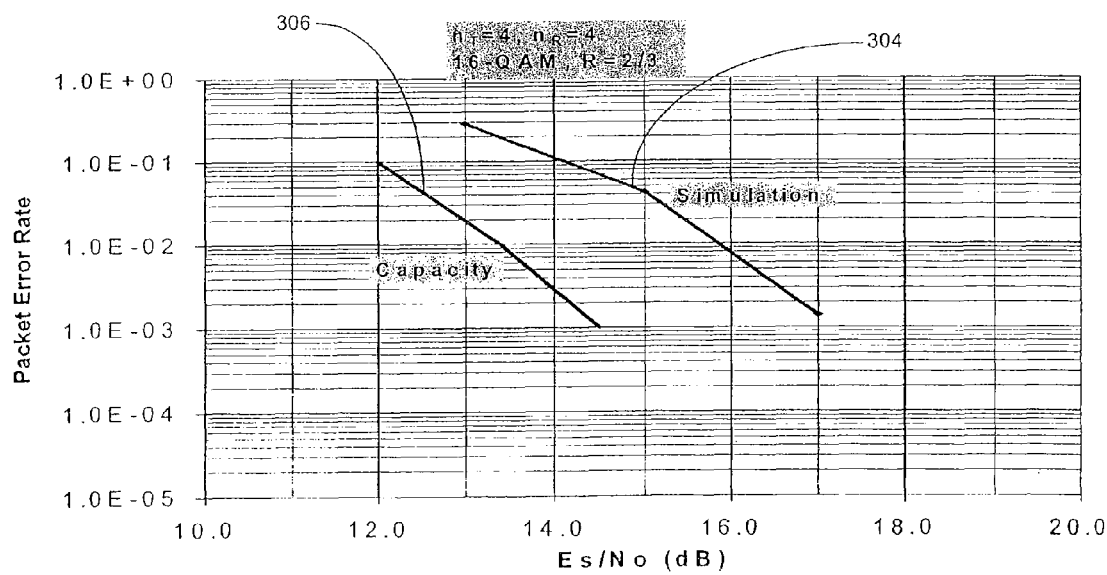
Figure 3C:
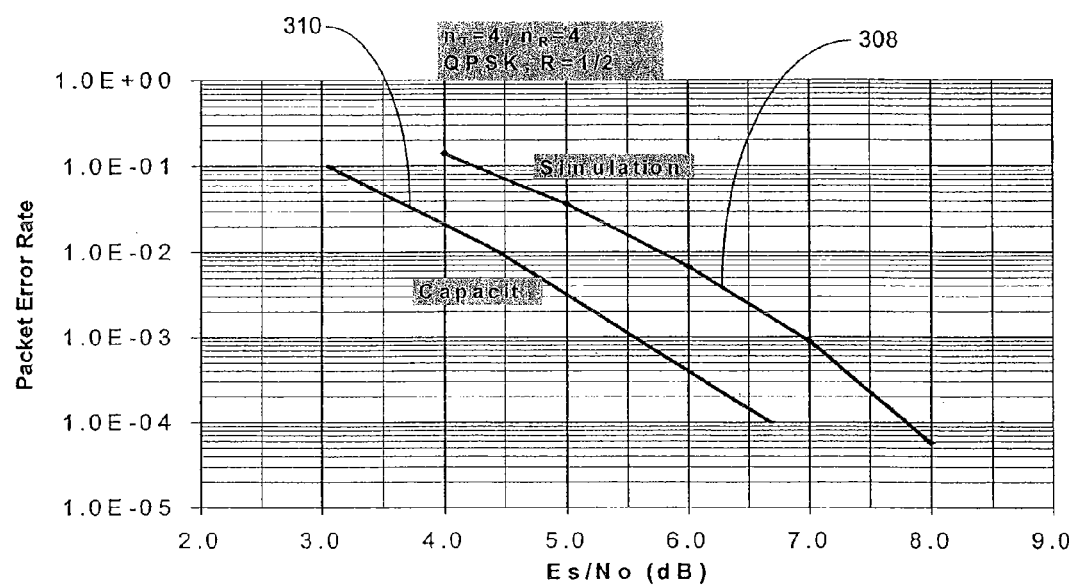

FIGS. 3A-3C illustrate simulations of the performance of the present invention.

Performance results of the codes of the present invention are shown in FIGS. 3A-3B. FIG. 3A shows the simulated performance 300 of a quasi-static fading channel in a MIMO system having 3 transmit antennas and 3 receive antennas, using a 32-QAM code at rate 3/4, with Shannon capacity 302 shown for comparison.

FIG. 3B shows the simulated performance 304 of a quasi-static fading channel in a MIMO system having 4 transmit antennas and 4 receive antennas, using a 64-QAM code at rate 2/3, with Shannon capacity 306 shown for comparison. FIG. 3C shows the simulated performance 308 of a quasi-static fading channel in a MIMO system having 4 transmit antennas and 4 receive antennas, using a QPSK code at rate 1/2, with Shannon capacity 310 shown for comparison.

The performance of the iterative LDPC decoder/MIMO detector of the present invention is approximately 1.5 dB away from the Shannon limit at FER=$10^{-2}$.

Figure 4A:
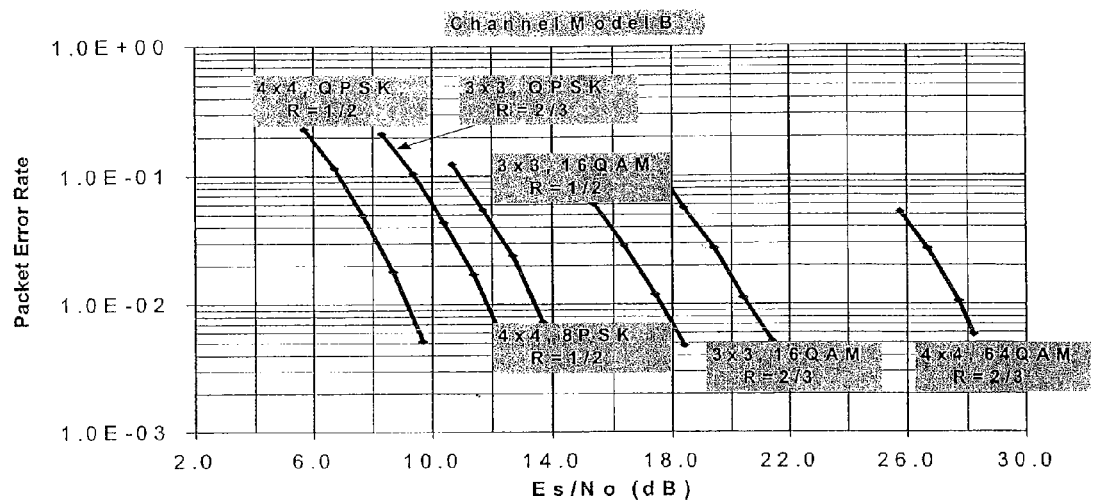
FIGS. 4A-4C illustrate simulations of the performance of short block length LDPC codes of the present invention.
Figure 4B:
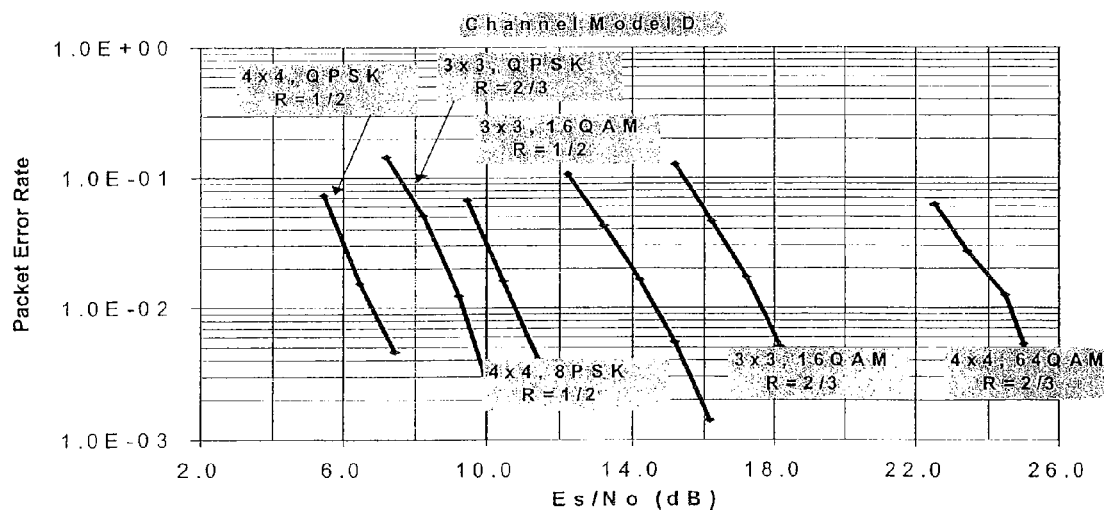
Figure 4C:
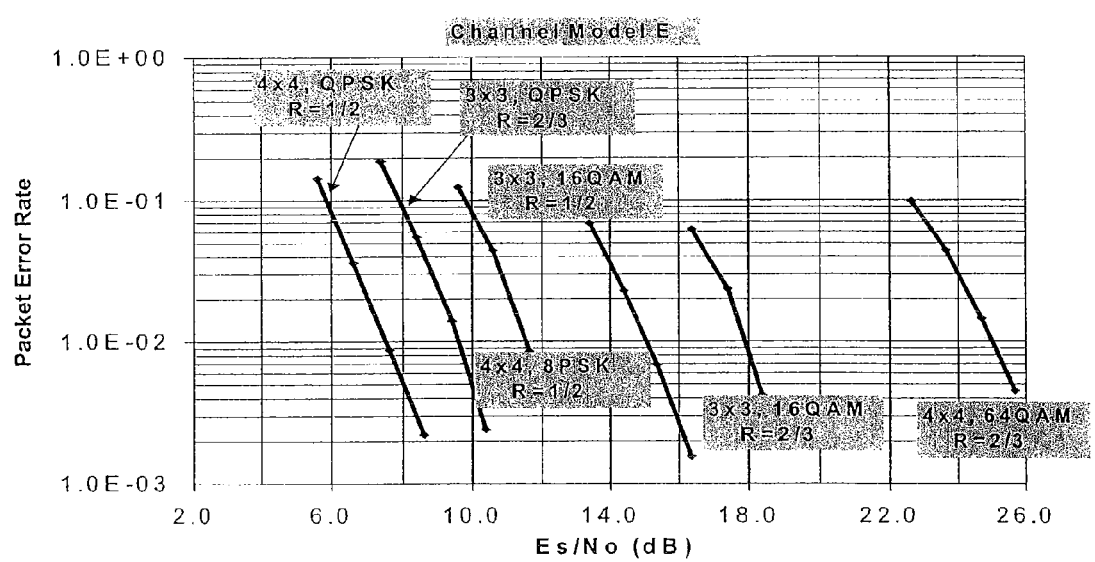

FIGS. 4A-4C illustrate simulations of the performance of short block length LDPC codes of the present invention.

For certain wireless LAN applications where the channel is very slowly fading, increasing the block length of codes generated by LDPC decoder 206 may not yield good enough performance to justify the extra complexity. In these scenarios, short block length LDPC codes with fully parallel decoding architecture may be preferable. Tables 8 and 9 show the parity check matrices of two LDPC codes with rates 1/2 and 2/3. Code length in each case is N=192. The $i^{th}$ row in the tables gives the check nodes connected to the $i^{th}$ bit node.

Flowchart

Figure 5:
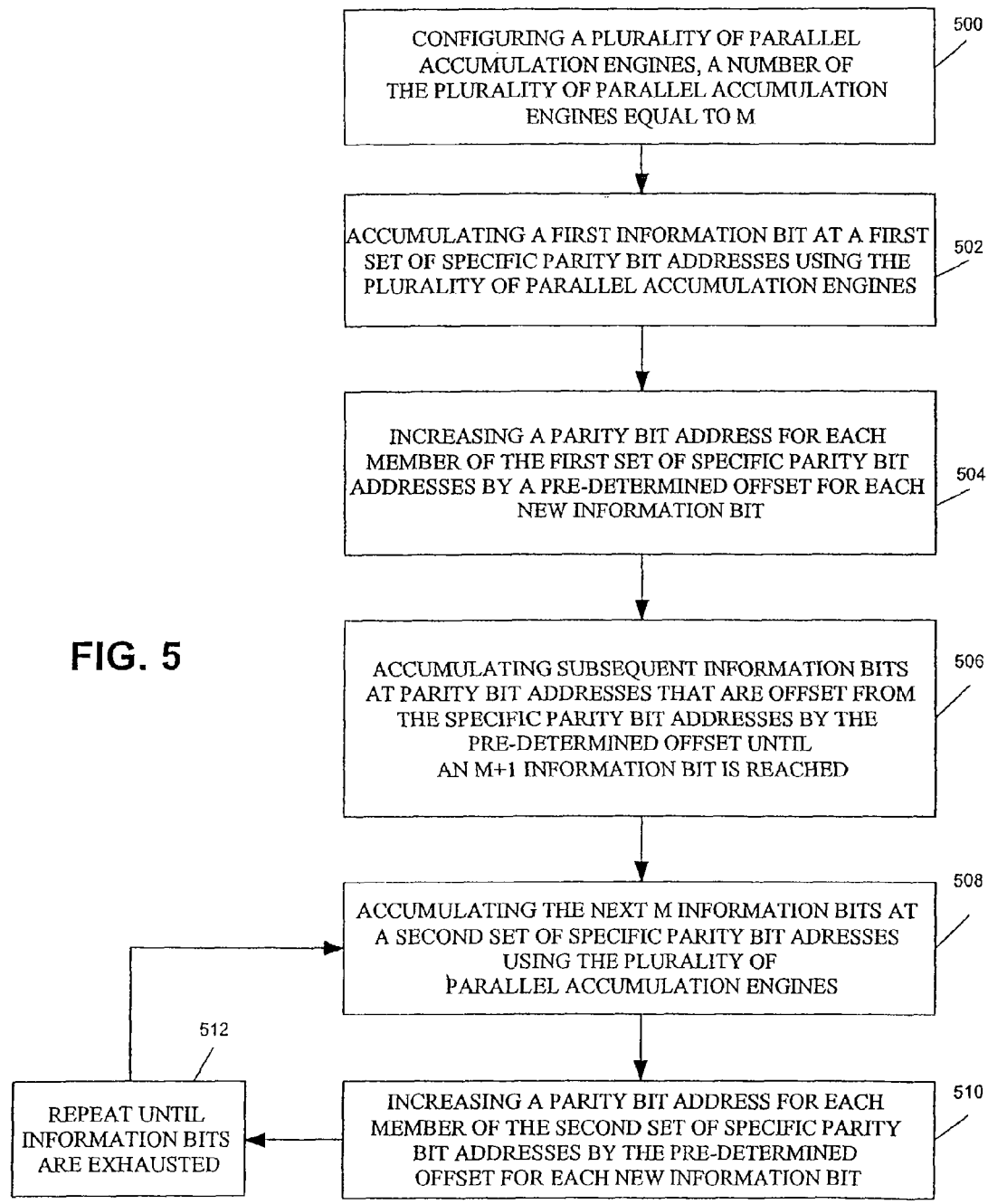
FIG. 5 illustrates a flowchart illustrating an exemplary method of the present invention.

FIG. 5 is a flowchart illustrating a method in accordance with the present invention.

Box 500 illustrates performing configuring a plurality of parallel accumulation engines, a number of the plurality of parallel accumulation engines equal to M.

Box 502 illustrates performing accumulating a first information bit at a first set of specific parity bit addresses using the plurality of parallel accumulation engines.

Box 504 illustrates performing increasing a parity bit address for each member of the first set of specific parity bit addresses by a pre-determined offset for each new information bit.

Box 506 illustrates performing accumulating subsequent information bits at parity bit addresses that are offset from the specific parity bit addresses by a pre-determined offset until an M+1 information bit is reached.

Box 508 illustrates performing accumulating the next M information bits at a second set of specific parity bit addresses using the plurality of parallel accumulation engines.

Box 510 illustrates performing increasing a parity bit address for each member of the second set of specific parity bit addresses by the pre-determined offset for each new information bit. and Box 512 illustrates performing repeating boxes 508 and 510 until the information bits are exhausted.

Conclusion

This concludes the description of the preferred embodiments of the present invention. The foregoing description of the preferred embodiment of the invention has been presented for the purposes of illustration and description. It is not intended to be exhaustive or to limit the invention to the precise form disclosed. Many modifications and variations are possible in light of the above teaching.

The present invention discloses methods and systems for designing LDPC codes using parity check matrices. A method in accordance with the present invention comprises configuring a plurality of parallel accumulation engines, a number of the plurality of parallel accumulation engines equal to M, accumulating a first information bit at a first set of specific parity bit addresses using the plurality of parallel accumulation engines, increasing a parity bit addresses for each member of the first set of specific parity bit addresses by a pre-determined offset for each new information bit, accumulating subsequent information bits at parity bit addresses that are offset from the specific parity bit addresses by a pre-determined offset until an M+1 information bit is reached, accumulating the next M information bits at a second set of specific parity bit addresses using the plurality of parallel accumulation engines, increasing a parity bit addresses for each member of the second set of specific parity bit addresses by the pre-determined offset for each new information bit; and repeating accumulating and increasing the addresses until the information bits are exhausted.

The method can optionally include use of the LDPC codes in a Multiple-Input, Multiple-Output (MIMO) system, use in an LDPC encoder, having the pre-determined offset be code-dependent, and accumulating the parity bits by adding each parity bit address to the immediately preceding parity bit address.

A system in accordance with the present invention comprises a plurality of parallel accumulation engines, a number of the plurality of parallel accumulation engines equal to M, and a parity bit check matrix, wherein a first information bit is accumulated at a first set of specific parity bit addresses using the plurality of parallel accumulation engines, the parity bit addresses for each member of the first set of specific parity bit addresses are increased by a pre-determined offset for each new information bit, subsequent information bits are accumulated at parity bit addresses that are offset from the specific parity bit addresses by the pre-determined offset until an M+1 information bit is reached, a next M information bits are accumulated at a second set of specific parity bit addresses using the plurality of parallel accumulation engines, wherein the parity bit addresses for each member of the second set of specific parity bit addresses are increased by the pre-determined offset for each new information bit, and each information bit in the plurality of information bits is accumulated using additional sets of specific parity bit addresses and pre-determined offsets until all information bits in the plurality of information bits are accumulated.

The system can optionally include use of the LDPC codes in a Multiple-Input, Multiple-Output (MIMO) system, use in an LDPC encoder or decoder, having the pre-determined offset be code-dependent, and accumulating the parity bits by adding each parity bit address to the immediately preceding parity bit address.

Another method in accordance with the present invention comprises accumulating a first information bit using a plurality of parallel accumulation engines at a first set of specific parity bit addresses using the plurality of parallel accumulation engines, increasing a parity bit addresses for each member of the first set of specific parity bit addresses by a pre-determined offset for each new information bit, accumulating subsequent information bits at parity bit addresses that are offset from the specific parity bit addresses by a pre-determined offset until an information bit is reached having an index number equal to a number of the plurality of parallel accumulation engines, accumulating the next number of the plurality of parallel accumulation engine information bits at a second set of specific parity bit addresses using the plurality of parallel accumulation engines, and increasing a parity bit addresses for each member of the second set of specific parity bit addresses by the pre-determined offset for each new information bit; wherein each information bit in the plurality of information bits is accumulated using additional sets of specific parity bit addresses and pre-determined offsets until all information bits in the plurality of information bits are accumulated.

The method can optionally include use of the LDPC codes in a Multiple-Input, Multiple-Output (MIMO) system, use in an LDPC encoder or decoder, having the pre-determined offset be code-dependent, and accumulating the parity bits by adding each parity bit address to the immediately preceding parity bit address.

It is intended that the scope of the invention be limited not by this detailed description, but rather by the claims appended hereto and the equivalents thereof. The above specification, examples and data provide a complete description of the manufacture and use of the composition of the invention. Since many embodiments of the invention can be made without departing from the spirit and scope of the invention, the invention resides in the claims hereinafter appended and the equivalents thereof.

TABLE 1

LDPC Code Parameters (n, k)

| Code Rate | LDPC Uncoded Block Length, k | LDPC Coded Block Length, n |
|---|---|---|
| ½ | 8000 | 16000 |
| ⅔ | 8000 | 12000 |
| ¾ | 7200 | 9600 |
| ⅚ | 8000 | 9600 |

TABLE 2

Number of Bit Nodes of Various Degrees

| Code Rate | 13 | 12 | 8 | 3 | 2 | 1 |
|---|---|---|---|---|---|---|
| ½ | | | 4800 | 3200 | 7999 | 1 |
| ⅔ | 800 | | | 7200 | 3999 | 1 |
| ¾ | | 800 | | 6400 | 2399 | 1 |
| ⅚ | 800 | | | 7200 | 1599 | 1 |

TABLE 3 q Values

| Code Rate | q |
|---|---|
| ⅔ | 10 |
| ½ | 20 |
| ¾ | 6 |
| ⅚ | 4 |

TABLE 4

Address of Parity Bit Accumulators (Rate ⅔)

0 1531 876 3403 1298 3085 277 2316 1180 2988 3233 1851 2127
1 2423 2843 1600 3571 3509 1732 794 2985 264 1366 2309 1932
2 1826 3364
3 1464 3371
4 3055 3767
5 649 2172
6 2607 2095
7 1842 559
8 1630 3150
9 1608 3558
0 526 2323
1 505 2305
2 2317 2594
3 3684 171
4 3831 2296
5 753 1878

TABLE 4-continued

Address of Parity Bit Accumulators (Rate 2/3)

6 3908 1737
7 1132 2962
8 2340 1550
9 2519 1769

TABLE 5

Address of Parity Bit Accumulators (Rate 1/2)

12 922 3230 286 6581 3068 2393 2290
13 1749 4368 7492 6487 354 4807 1829
14 5381 4074 4464 7568 1651 2664 5158
15 7823 4362 7543 6671 7320 2292 3696
16 5734 6843 6457 2774 1665 4823 1917
17 958 4478 4582 5620 6266 1796 1150
18 1730 7085 7145 6355 6101 5839 6442
19 4572 1780 1133 4219 5778 1055 5529
0 3597 6167
1 2544 53
2 5955 169
3 3051 1026
4 3420 3917
5 5259 272
6 1313 3599
7 6956 1991
8 4105 2744
9 4106 7001
10 3467 6115
11 7948 4436

TABLE 6

Address of Parity Bit Accumulators (Rate 3/4)

0 1071 1268 595 804 1947 1564 713 1736 1618 2281 317
1 1382 275 1763 452 2254 675 1105 1266 1824 1161 1586
2 617 840
3 144 2101
4 2293 874
5 2104 2211
0 802 368
1 1873 202
2 261 1925
3 1806 711
4 314 2214
5 1265 139
0 316 732
1 291 1930
2 942 1067
3 1333 121
4 698 2270
5 1127 1197

TABLE 7

Address of Parity Bit Accumulators (Rate 5/6)

0 1265 699 614 1408 156 521 228 339 1539 1352 991 1125
1 543 198 1211 465 1063 638 826 965 121 1342 396 690
2 770 212
3 252 557
0 576 1529
1 586 860
2 809 1079
3 1419 1114
0 1110 1399
1 665 148
2 615 926
3 356 1341
0 349 567
1 1192 901

TABLE 7-continued

Address of Parity Bit Accumulators (Rate 5/6)

2 1011 778
3 418 888
0 381 1478
1 1246 175
2 163 1284
3 480 1321

TABLE 8

Parity Check Matrix of R = 1/2 LDPC code (N = 192)

20 33 77
17 83 48
89 4 92
58 82 27
32 26 67
86 40 24
24 0 33
58 23 84
64 5 62
81 40 60
59 9 82
53 82 54
29 59 79
46 54 45
91 78 28
90 58 87
5 35 34
68 45 37
31 38 63
83 55 84
16 30 75
89 77 48
6 3 65
70 8 87
90 41 29
17 56 95
52 34 21
86 60 0
3 38 93
28 61 55
12 70 19
5 36 92
73 72 56
36 47 64
78 8 2
83 76 85
43 85 24
70 23 27
2 15 67
1 91 39
38 71 20
28 67 80
9 49 32
36 8 50
44 19 94
4 1 50
75 10 7
51 49 25
13 81 88
34 50 25
11 10 57
69 75 95
44 57 91
16 74 26
89 32 62
80 6 61
63 73 79
72 39 0
21 61 15
85 88 94
11 20 87
18 53 56
93 90 80
35 37 44

TABLE 8-continued

Parity Check Matrix of R = ½ LDPC code (N = 192)

2 31 27
41 59 40
55 46 78
42 88 22
69 71 51
31 76 46
51 84 7
12 37 64
73 17 43
35 79 68
7 11 93
62 60 52
18 21 65
43 66 47
1 41 74
42 16 48
14 76 10
42 52 77
47 30 63
29 30 69
6 4 25
9 94 3
66 49 71
39 45 95
86 12 22
19 18 74
22 26 13
14 13 23
68 54 81
15 33 72
66 14 53
65 92 57
0 1
1 2
2 3
3 4
4 5
5 6
6 7
7 8
8 9
9 10
10 11
11 12
12 13
13 14
14 15
15 16
16 17
17 18
18 19
19 20
20 21
21 22
22 23
23 24
24 25
25 26
26 27
27 28
28 29
29 30
30 31
31 32
32 33
33 34
34 35
35 36
36 37
37 38
38 39
39 40
40 41
41 42
42 43
43 44
44 45
45 46

TABLE 8-continued

Parity Check Matrix of R = ½ LDPC code (N = 192)

46 47
47 48
48 49
49 50
50 51
51 52
52 53
53 54
54 55
55 56
56 57
57 58
58 59
59 60
60 61
61 62
62 63
63 64
64 65
65 66
66 67
67 68
68 69
69 70
70 71
71 72
72 73
73 74
74 75
75 76
76 77
77 78
78 79
79 80
80 81
81 82
82 83
83 84
84 85
85 86
86 87
87 88
88 89
89 90
90 91
91 92
92 93
93 94
94 95
95

TABLE 9

Parity Check Matrix of R = ⅔ LDPC code (N = 192)

13 22 51
11 55 32
59 3 61
38 54 18
21 17 45
57 26 16
16 0 21
39 15 56
43 3 41
54 27 40
39 6 55
35 55 36
19 39 52
31 36 30
61 52 60
39 58 3
23 22 45
30 25 20
25 42 55
37 56 11

TABLE 9-continued

Parity Check Matrix of R = ⅔ LDPC code (N = 192)

20 50 59
52 32 4
2 43 47
5 57 60
27 20 11
38 63 35
23 15 57
40 0 2
25 62 19
41 37 8
47 13 3
24 61 49
48 37 24
31 42 52
5 1 56
51 57 29
57 17 47
16 19 1
5 10 45
1 61 26
25 48 14
19 45 54
6 32 22
24 5 33
29 14 62
2 1 34
50 6 4
34 33 17
8 55 58
23 33 16
7 6 37
46 50 63
29 38 60
11 50 18
60 22 41
54 4 41
42 49 53
49 26 0
14 41 10
56 59 63
7 13 58
12 37 39
62 60 56
23 24 30
0 19 27
40 26 38
31 54 28
59 15 47
48 35 23
53 31 34
58 5 26
31 43 50
12 29 25
54 47 7
62 43 36
13 15 44
30 44 34
0 28 51
29 13 33
11 10 51
7 29 35
52 27 41
25 27 47
4 2 21
4 61 44
32 46 30
32 63 58
2 18 15
14 53 16
22 9 4
10 43 21
53 12 45
48 7 10
34 59 8
3 40 1
9 55 17
46 31 59
9 16 18
35 34 51
15 28 48
53 3 37
8 19 24
33 44 42
20 1 12
36 24 32
42 18 12
26 43 20
49 28 9
35 44 46
9 61 40
14 50 39
49 17 14
12 6 36
7 20 21
11 28 62
8 6 48
53 63 36
62 46 0
13 38 5
51 49 8
28 44 63
46 2 10
60 23 42
18 17 30
38 9 58
21 56 52
22 27 57
33 45 40
0 1
1 2
2 3
3 4
4 5
5 6
6 7
7 8
8 9
9 10
10 11
11 12
12 13
13 14
14 15
15 16
16 17
17 18
18 19
19 20
20 21
21 22
22 23
23 24
24 25
25 26
26 27
27 28
28 29
29 30
30 31
31 32
32 33
33 34
34 35
35 36
36 37
37 38
38 39
39 40
40 41
41 42
42 43
43 44
44 45
45 46
46 47
47 48

TABLE 9-continued

Parity Check Matrix of R = ⅔ LDPC code (N = 192)

```
48 49
49 50
50 51
51 52
52 53
53 54
54 55
55 56
56 57
57 58
58 59
59 60
60 61
61 62
62 63
63
```

What is claimed is:

1. A Low Density Parity Check (LDPC) encoder used to code data, the LDPC encoder generating parity bits of LDPC codes from input data comprising a plurality of information bits, the LDPC encoder comprising:
a plurality of parallel accumulators, a number of the plurality of parallel accumulators equal to M; and
a parity bit check matrix, wherein
a first information bit is accumulated at a first set of specific parity bit addresses using the plurality of parallel accumulators;
the parity bit addresses for each member of the first set of specific parity bit addresses are increased by a pre-determined offset for each new information bit;
subsequent information bits are accumulated at parity bit addresses that are offset from the specific parity bit addresses by the pre-determined offset until an M+1 information bit is reached;
a next M information bits are accumulated at a second set of specific parity bit addresses using the plurality of parallel accumulators, wherein the parity bit addresses for each member of the second set of specific parity bit addresses are increased by the pre-determined offset for each new information bit; and
each information bit in the plurality of information bits is accumulated using additional sets of specific parity bit addresses and pre-determined offsets until all information bits in the plurality of information bits are accumulated.

2. The LDPC encoder of claim 1, wherein the LDPC encoder is part of a Multiple-Input, Multiple-Output (MIMO) system.

3. The LDPC encoder of claim 1, wherein the pre-determined offset is code-dependent.

4. The LDPC encoder of claim 1, wherein the LDPC encoder further accumulates the parity bits by adding each parity bit address to an immediately preceding parity bit address.

5. The LDPC encoder of claim 1, wherein a number of parallel accumulators is 400.

6. The LDPC encoder of claim 1, wherein LDPC codes generated by the LDPC encoder are short block length codes.

7. The LDPC encoder of claim 1, wherein the LDPC encoder is part of a broadcast system.

8. The LDPC encoder of claim 7, wherein the broadcast system is a wireless broadcast system.

9. The LDPC encoder of claim 8, wherein the wireless broadcast system comprises at least one satellite.

10. A broadcast system comprising:
at least one transmitter;
a plurality of input data sources, coupled to the at least one transmitter, each data source comprising a plurality of information bits; and
a Low Density Parity Check (LDPC) encoder used to code data, the LDPC encoder coupled to the plurality of input data sources and generating parity bits of LDPC codes from the plurality of input data sources, the LDPC encoder comprising:
a plurality of parallel accumulators, a number of the plurality of parallel accumulators equal to M; and
a parity bit check matrix, wherein
a first information bit of a first data source is accumulated at a first set of specific parity bit addresses using the plurality of parallel accumulators;
the parity bit addresses for each member of the first set of specific parity bit addresses are increased by a pre-determined offset for each new information bit;
subsequent information bits from the first data source are accumulated at parity bit addresses that are offset from the specific parity bit addresses by the pre-determined offset until an M+1 information bit is reached;
a next M information bits from the first data source are accumulated at a second set of specific parity bit addresses using the plurality of parallel accumulators, wherein the parity bit addresses for each member of the second set of specific parity bit addresses are increased by the pre-determined offset for each new information bit from the first data source; and
each information bit in the plurality of information bits from the first data source is accumulated using additional sets of specific parity bit addresses and pre-determined offsets until all information bits in the plurality of information bits from the first data source are accumulated.

11. The broadcast system of claim 10, wherein the LDPC encoder is part of a Multiple-Input, Multiple-Output (MIMO) system.

12. The broadcast system of claim 10, wherein the pre-determined offset is code-dependent.

13. The broadcast system of claim 10, wherein the LDPC encoder further accumulates the parity bits by adding each parity bit address to an immediately preceding parity bit address.

14. The broadcast system of claim 10, wherein a number of parallel accumulators is 400.

15. The broadcast system of claim 10, wherein LDPC codes generated by the LDPC encoder are short block length codes.

16. The broadcast system of claim 10, wherein the broadcast system further comprises at least one receiver.

17. The broadcast system of claim 10, wherein the broadcast system is a wireless broadcast system.

18. The broadcast system of claim 17, wherein the wireless broadcast system comprises at least one satellite.

19. The broadcast system of claim 10, wherein the LDPC encoder encodes data from each of the data sources in the plurality of data sources.

* * * * *